United States Patent
De et al.

(10) Patent No.: US 8,741,776 B2
(45) Date of Patent: Jun. 3, 2014

(54) PATTERNING PROCESS FOR FIN-LIKE FIELD EFFECT TRANSISTOR (FINFET) DEVICE

(75) Inventors: Ho Wei De, Hsinchu (TW); Ming-Feng Shieh, Yongkang (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/368,144

(22) Filed: Feb. 7, 2012

(65) Prior Publication Data

US 2013/0203257 A1 Aug. 8, 2013

(51) Int. Cl.
*H01L 21/311* (2006.01)

(52) U.S. Cl.
USPC ........... 438/703; 438/699; 438/717; 438/761; 438/942; 438/950

(58) Field of Classification Search
CPC ..................... H01L 21/823431; H01L 21/845; G03F 1/36
USPC ......... 438/689, 699, 717, 723, 724, 756, 757, 438/761, 764, 769, 942, 948, 950, 694, 438/700–703, 951; 430/5; 118/504; 257/E21.231, E21.232, E21.233, 257/E21.235, E21.236
See application file for complete search history.

(56) References Cited

U.S. PATENT DOCUMENTS

| | | | | |
|---|---|---|---|---|
| 6,063,688 A * | 5/2000 | Doyle et al. | ................... | 438/424 |
| 6,571,384 B2 * | 5/2003 | Shin et al. | ..................... | 438/703 |
| 6,573,027 B1 * | 6/2003 | Imai | ................. | 430/311 |
| 7,151,040 B2 * | 12/2006 | Tran et al. | ..................... | 438/401 |
| 7,253,118 B2 * | 8/2007 | Tran et al. | ..................... | 438/717 |
| 7,598,174 B1 * | 10/2009 | Zhuang | ......................... | 438/689 |
| 7,611,944 B2 * | 11/2009 | Tran et al. | ..................... | 438/241 |
| 7,662,721 B2 * | 2/2010 | Manger et al. | ................ | 438/717 |
| 7,759,235 B2 * | 7/2010 | Zhuang et al. | ................ | 438/587 |
| 7,851,371 B2 * | 12/2010 | Koretsune et al. | ............ | 438/736 |
| 7,906,435 B2 * | 3/2011 | Nishiyama | ..................... | 438/717 |
| 7,989,307 B2 * | 8/2011 | Parekh et al. | ................. | 438/424 |
| 8,030,222 B2 * | 10/2011 | Tran et al. | ..................... | 438/787 |
| 8,242,021 B2 * | 8/2012 | Moon | ........................... | 438/696 |

(Continued)

OTHER PUBLICATIONS

Ming-Feng Shieh et al., Unpublished U.S. Appl. No. 13/339,646 filed Dec. 29, 2011 entitled "Mandrell Modification for Achieving Single Fin Fin-Like Field Effect Transistor (FinFET) Device", 53 pages.

*Primary Examiner* — Fernando L Toledo
*Assistant Examiner* — Christine C Lau
(74) *Attorney, Agent, or Firm* — Haynes and Boone, LLP

(57) ABSTRACT

A method for patterning a plurality of features in a non-rectangular pattern on an integrated circuit device includes providing a substrate including a surface with a first layer and a second layer. Forming a plurality of elongated protrusions in a third layer above the first and second layers. Forming a first patterned layer over the plurality of elongated protrusions. The plurality of elongated protrusions are etched to form a first pattern of the elongated protrusions, the first pattern including at least one inside corner. Forming a second patterned layer over the first pattern of elongated protrusions and forming a third patterned layer over the first pattern of elongated protrusions. The plurality of elongated protrusions are etched using the second and third patterned layers to form a second pattern of the elongated protrusions, the second pattern including at least one inside corner.

20 Claims, 23 Drawing Sheets

(56) References Cited

U.S. PATENT DOCUMENTS

| | | | |
|---|---|---|---|
| 8,338,310 B2* | 12/2012 | Jung et al. | 438/717 |
| 2006/0046422 A1* | 3/2006 | Tran et al. | 438/401 |
| 2006/0194378 A1* | 8/2006 | Yagishita | 438/183 |
| 2007/0049011 A1* | 3/2007 | Tran | 438/637 |
| 2007/0059891 A1* | 3/2007 | Furukawa et al. | 438/299 |
| 2007/0063276 A1* | 3/2007 | Beintner et al. | 257/347 |
| 2007/0161245 A1* | 7/2007 | Rathsack et al. | 438/689 |
| 2007/0281219 A1* | 12/2007 | Sandhu | 430/5 |
| 2008/0038910 A1* | 2/2008 | Carlson | 438/551 |
| 2008/0057692 A1* | 3/2008 | Wells et al. | 438/597 |
| 2009/0026543 A1* | 1/2009 | Yang | 257/365 |
| 2009/0273051 A1* | 11/2009 | Parekh et al. | 257/506 |
| 2011/0097863 A1* | 4/2011 | Shieh et al. | 438/268 |
| 2011/0151359 A1* | 6/2011 | Shieh et al. | 430/5 |

* cited by examiner

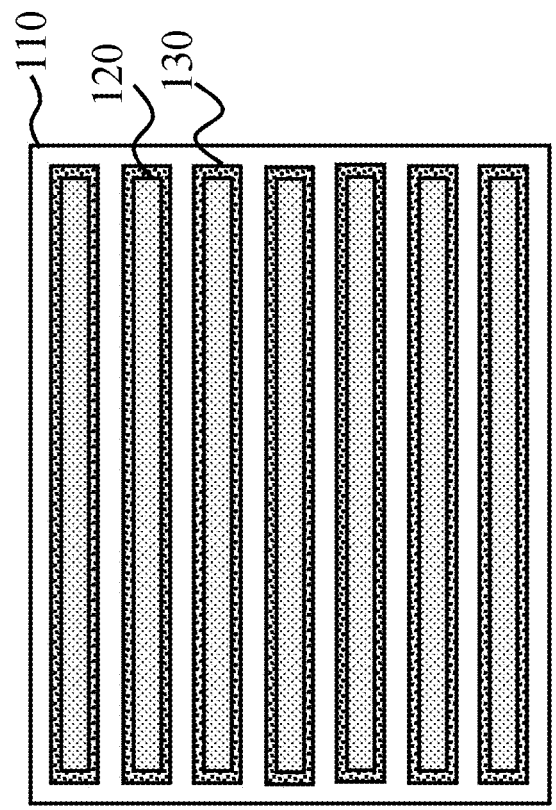
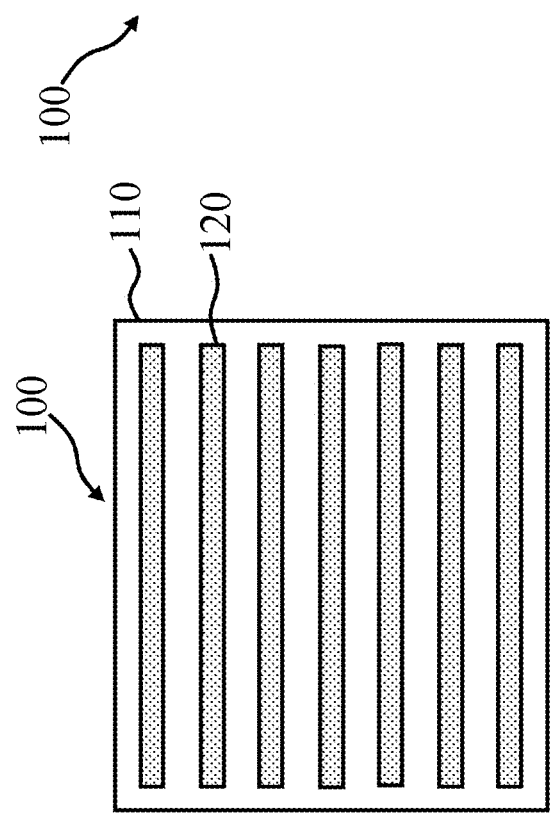
FIG. 1A
FIG. 1B

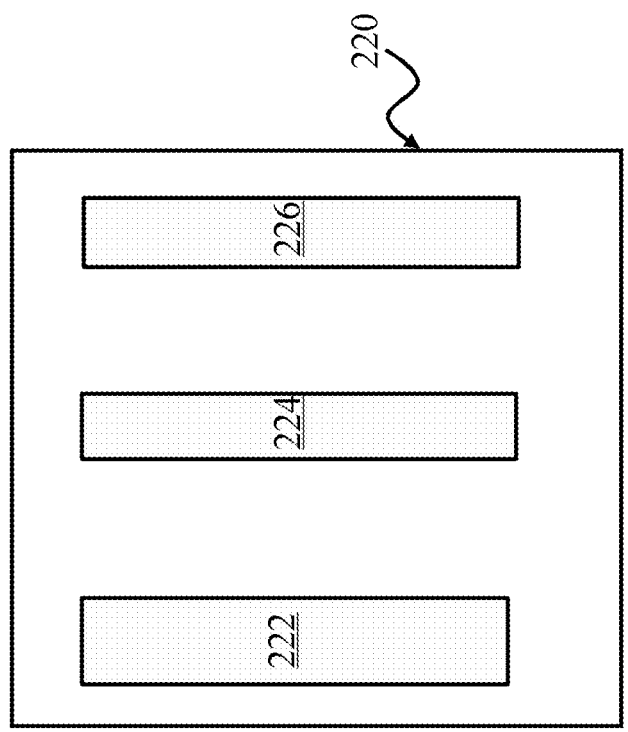

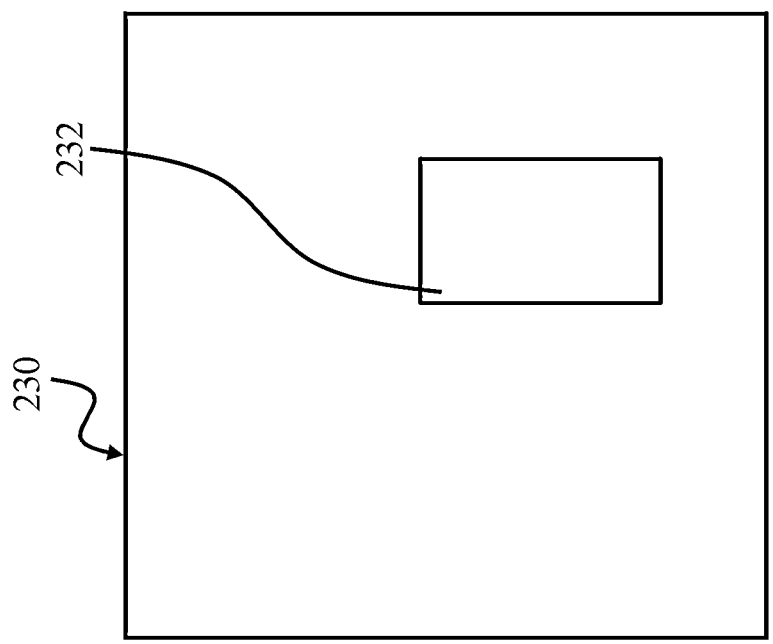

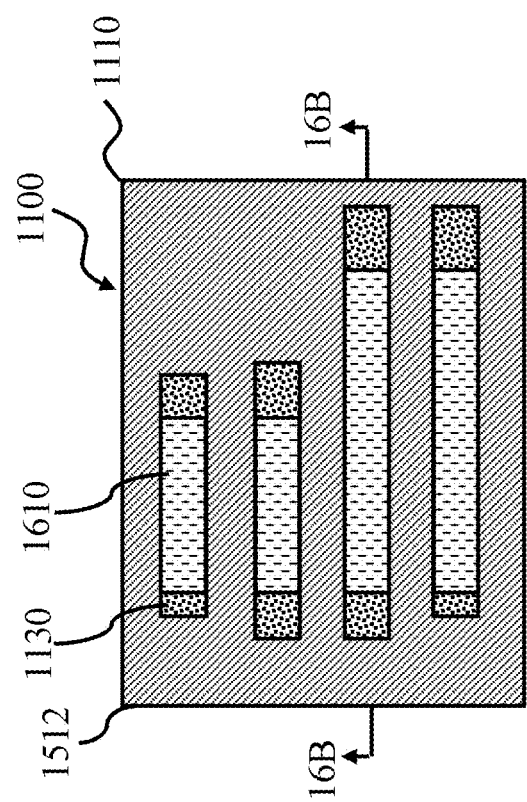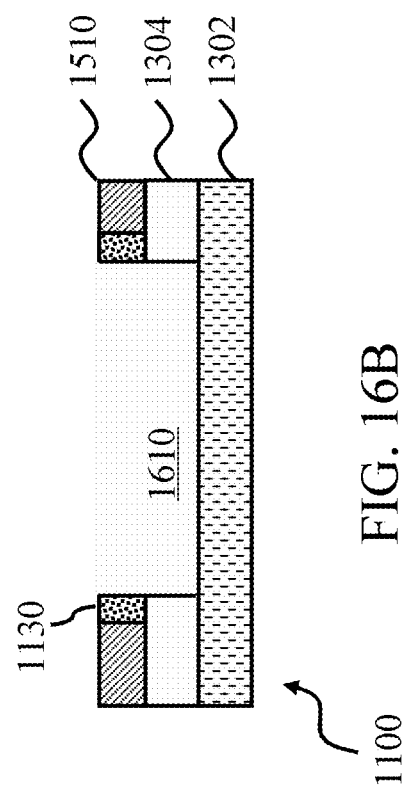
FIG. 16A
FIG. 16B

PATTERNING PROCESS FOR FIN-LIKE FIELD EFFECT TRANSISTOR (FINFET) DEVICE

BACKGROUND

Integrated circuit (IC) technologies are constantly being improved. Such improvements frequently involve scaling down device geometries to achieve lower fabrication costs, higher device integration density, higher speeds, and better performance. Lithography is frequently used for forming components of an integrated circuit device, where generally, an exposure tool passes light through a mask or reticle and focuses the light onto a resist layer of a wafer, resulting in the resist layer having an image of integrated circuit components therein. Forming device patterns with smaller dimensions is limited by a resolution of the exposure tool. For example, forming fin-like field effect (FinFET) devices is limited by current lithography resolution limits. Accordingly, although existing lithography techniques have been generally adequate for their intended purposes, as device scaling down continues, they have not been entirely satisfactory in all respects.

SUMMARY

The present disclosure describes integrated circuit devices, processing methods, and masks for use in semiconductor processing. In one embodiment, a method for patterning a plurality of features in a non-rectangular pattern, such a on an integrated circuit device, includes providing a substrate including a surface with a first layer and a plurality of elongated protrusions in a second layer above the first layer, the elongated protrusions extending in a first direction. The method further includes providing a first patterned mask layer on the plurality of elongated protrusions using a first mask and patterning the plurality of elongated protrusions using the first patterned mask layer to form a first modified pattern of elongated protrusions. The method also includes providing a second patterned mask layer on the first modified pattern of elongated protrusions using a second mask. The second patterned mask layer extends perpendicular to the first direction, and at least a portion of the plurality of elongated protrusions that would be inside the non-rectangular pattern would be altered by a subsequent patterning process. The method also includes providing a third patterned mask layer on the first modified pattern of elongated protrusions using a third mask, the third patterned mask layer being of a different material than the second patterned mask layer and positioned to prevent the portion of the elongated protrusions from being altered by the subsequent patterning process. The method further includes performing the subsequent patterning process on the first modified pattern of elongated protrusions using the second mask layer and the third mask layer to form the plurality of features in the non-rectangular pattern.

In another embodiment, a method for patterning a plurality of features in a non-rectangular pattern, such a on an integrated circuit device, includes providing a substrate including a surface with a first layer and a second layer, forming a plurality of elongated protrusions in a third layer above the first and second layers, and forming a first patterned layer over the plurality of elongated protrusions. The plurality of elongated protrusions are etched to form a first pattern of the elongated protrusions, the first pattern including at least one inside corner. The method also includes forming a second patterned layer over the first pattern of elongated protrusions and forming a third patterned layer over the first pattern of elongated protrusions. The plurality of elongated protrusions are etched using the second and third patterned layers to form a second pattern of the elongated protrusions, the second pattern including at least one inside corner.

The present disclosure also describe a mask set for shaping a plurality of features into a non-rectangular configuration. In one embodiment, the mask set includes three masks. A first mask includes a non-rectangular pattern for patterning a plurality of fins. A second mask includes a plurality of rectangular patterns that overlap some, but not all, of the first non-rectangular pattern. A third mask includes one or more patterns that overlap the portions of the non-rectangular pattern that are not overlapped by the rectangular patterns of the second mask.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

FIGS. 1A-1C are top views of an integrated circuit device on which a plurality of spacers are formed.

FIGS. 2A-2C are top views of a series of masks used for further processing the device of FIG. 1 according to one or more embodiments of the present disclosure.

FIGS. 12A-17B are top and cross-sectional views of the integrated circuit device of FIG. 1 being processed using the masks of FIGS. 11A-1C, according to one or more additional embodiments of the present disclosure.

DETAILED DESCRIPTION

Figure 1C:
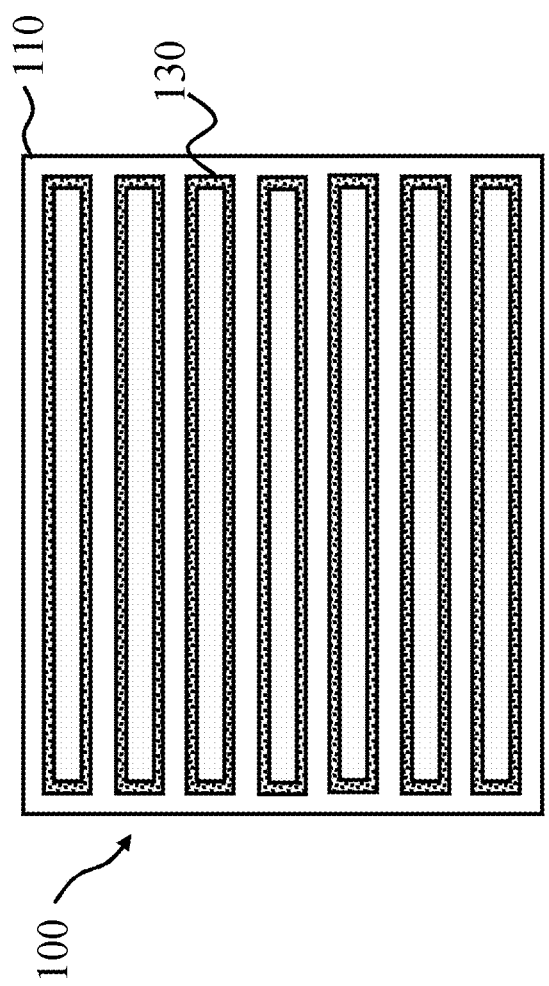

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to an integrated circuit device during various stages of fabrication. The integrated circuit device is an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. In some of the depicted embodiments, as further discussed below, the integrated circuit device includes various FinFET devices, and the integrated circuit device is illustrated during various stages of FinFET device fabrication. The term FinFET device refers to any fin-based, multi-gate transistor. Additional features can be added in the integrated circuit device, and some of the features described below can be replaced or eliminated in other embodiments of the integrated circuit device.

Referring to FIGS. 1A-1C, a first or main masking process is performed to define a width and a pitch of fins of various fin structures of the integrated circuit device 100, where the fin structures are included in various FinFET devices. In FIG. 1A, a substrate 110 is provided. In the present example, the substrate 110 is a semiconductor substrate including a stack of silicon oxynitride (SiON) and silicon dioxide (SiO2). Alternatively or additionally, the substrate 110 includes an elementary semiconductor, such as silicon or germanium; a compound semiconductor, such as silicon carbide, gallium arsenide, gallium phosphide, indium phosphide, indium arsenide, and/or indium antimonide; or combinations thereof. Alternatively, the substrate 110 is a silicon-on-insulator (SOI) substrate, which can be fabricated using separation by implantation of oxygen (SIMOX), wafer bonding, or other methods. The substrate 110 may include various doped regions and other suitable features.

An array of mandrels 120 are disposed over the substrate 110, where adjacent mandrels 120 are spaced from one another. The mandrels 120 include a patterning or masking material, such as a resist material, polysilicon, silicon oxide, silicon nitride, other patterning or masking material, or combinations thereof. In an example, forming the mandrels 120 includes depositing a patterning or masking layer (such as a polysilicon layer) over the substrate 110; forming a resist layer over the masking layer; using a mandrel mask (which may be referred to as a main mask) to expose the resist layer to radiation, thereby forming exposed portions of the resist layer and unexposed portions of the resist layer; removing the exposed portions or unexposed portions of the resist layer (for example, by subjecting the exposed resist layer to a developing solution), thereby forming a patterned resist layer that exposes portions of the masking layer; and using the patterned resist layer to etch the masking layer, specifically, the exposed portions of the masking layer, to form the mandrels 120 as illustrated in FIG. 1A. In other examples, the mandrels 120 are formed by various deposition processes, lithography processes, etching processes, or combinations thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other deposition methods, or combinations thereof. The lithography processes may include resist coating (for example, spin-on coating), soft baking, mask aligning, exposure, post-exposure baking, developing the resist, rinsing, drying (for example, hard baking), other lithography process, or combinations thereof. Alternatively, the lithography processes can be implemented or replaced by other methods, such as maskless lithography, electron-beam writing, ion-beam writing, and/or nanoimprint technology. The etching processes include dry etching, wet etching, other etching methods, or combinations thereof.

In FIG. 1B, spacers 130 are formed over the substrate 110, such that each of the mandrels 120 is surrounded by a spacer 130; and in FIG. 1C, the mandrels 120 are removed, for example, by an etching process, such that the spacers 130 remain disposed over the substrate 110. The spacers 130 include a patterning or masking material, which in the present embodiment is silicon nitride (SiN). Other examples include a resist material, polysilicon, silicon oxide, other patterning or masking material, or combinations thereof. The spacers 130 are formed by various deposition processes, lithography processes, etching processes, or combinations thereof, such as the processes described herein. The spacers 130 on opposite sidewalls of each mandrel 120 have a width that is less than the width of each mandrel 120. The spacers on opposite sidewalls of each mandrel 120 are also spaced from one another by a pitch that is less than the pitch of the mandrels 120. As further described below, the spacers 130 are used to form the fin structures of the integrated circuit device 100, and are hereinafter referred to as fins 130.

It is desired to pattern the group of fins 130 shown in FIG. 1C to a predetermined pattern. For the sake of example, the following discussion will be directed to forming an L-shaped pattern of fins 130. An L-shaped pattern emphasizes some difficulties that often occur in the patterning process. As will be discussed further below, many of these difficulties include corner rounding and poor line cutting of the individual fins, especially around inside corners such as in the inside, right-angle corner of the L-shape.

Figure 2A:
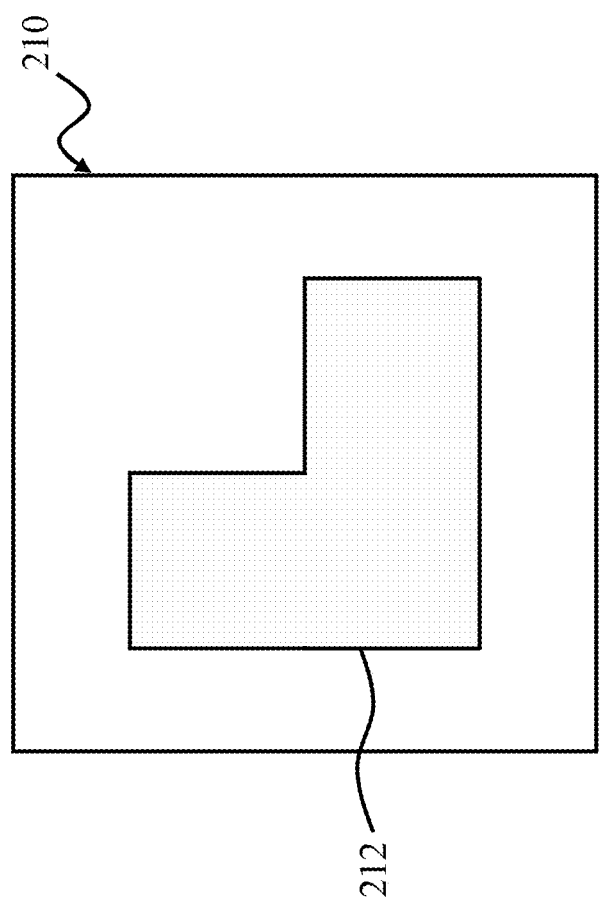
Figure 3A:
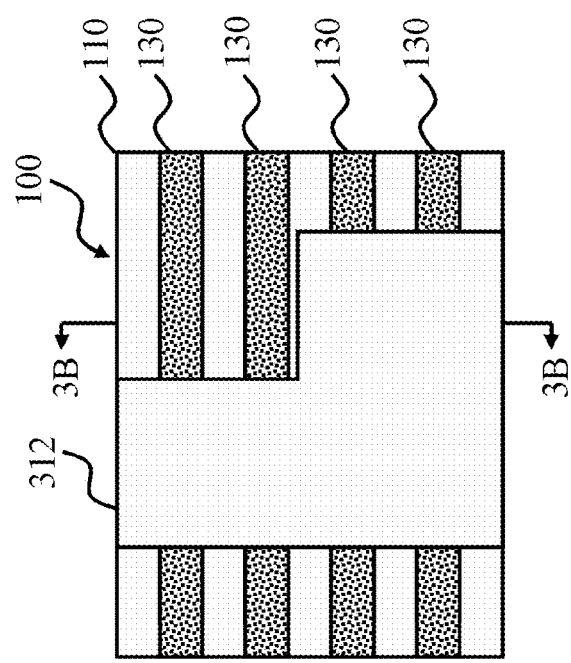
FIGS. 3A-10B are top and cross-sectional views of the integrated circuit device of FIG. 1 being processed using the masks of FIGS. 2A-2C, according to one or more embodiments of the present disclosure.
Figure 3B:
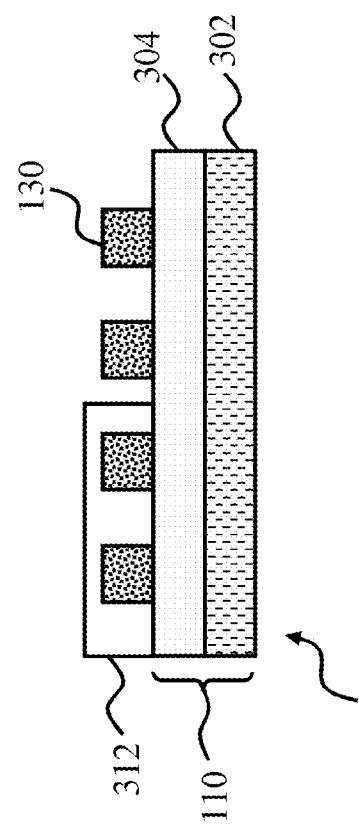

Referring now to FIGS. 2A-2C, a set of three masks 210, 220, 230 will be used in the present embodiment to arrange the fins 130 into an L-shape pattern. It is understood that the masks can be modified according to general understandings of lithography and mask making, as is well known in the art. For example, the present examples will implement a positive photoresist, in that clear tones on the mask are used to expose corresponding patterns on the photoresist. Of course, negative photoresist can also be used, in that dark tones on the mask are used to expose corresponding patterns on the photoresist. Also, known techniques such as optical proximity correction can be used, as is well known in the art. Furthermore, the lithography processes discussed below can be of various types and include multiple steps, such as those discussed above with reference to FIGS. 1A-1C.

The masks can be formed in various technologies. For example, the masks may be formed using a binary technology. The binary mask includes a transparent substrate (for example, fused quartz) and an opaque material (for example, chromium) coated in the opaque regions of the mask. In another example, the masks are formed using a phase shift technology, where various features in the pattern formed on the masks are configured to have proper phase difference to enhance the resolution and imaging quality. In various examples, the phase shift mask (PSM) can be an attenuated PSM or alternating PSM.

The first mask 210 is used for line cutting, and provides the L-shaped pattern 212 that is desired in the present embodiment. The L-shaped pattern 212 is shown to be a dark tone, while a surrounding area is shown to be a clear tone. The L-shaped pattern 212 will be used to form a corresponding L-shape pattern of the fins 130 on the device 100. The second mask 220 includes a plurality of patterns 222, 224, 226 that will be used for end cutting the various fins 130, for improved accuracy and precision of the L-shaped pattern. It is noted that the patterns 222, 224, 226 do not correspond exactly with the line ends of the L-shaped pattern 212. The patterns 222, 224, 226 are shown to be a clear tone, while a surrounding area is shown to be a dark tone. The third mask 230 includes one or more patterns 232, that will be used in conjunction with the patterns 222, 224, 226 as further discussed below. The pattern 232 is shown to be a dark tone, while a surrounding area is shown to be a clear tone.

Figure 4A:
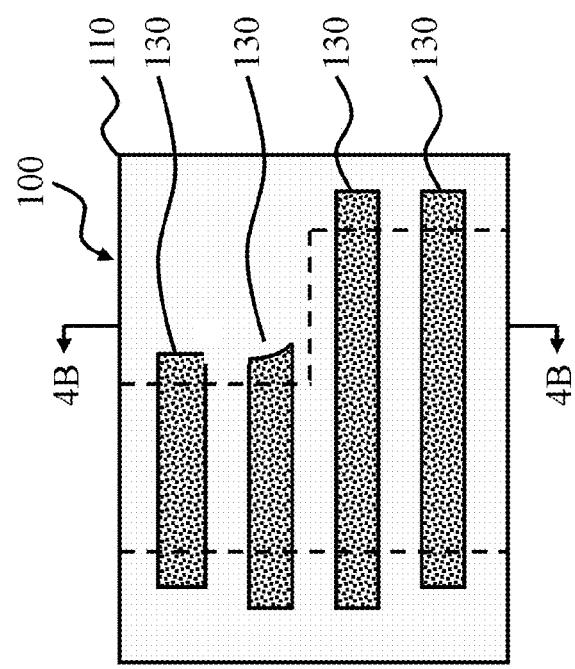
Figure 4B:
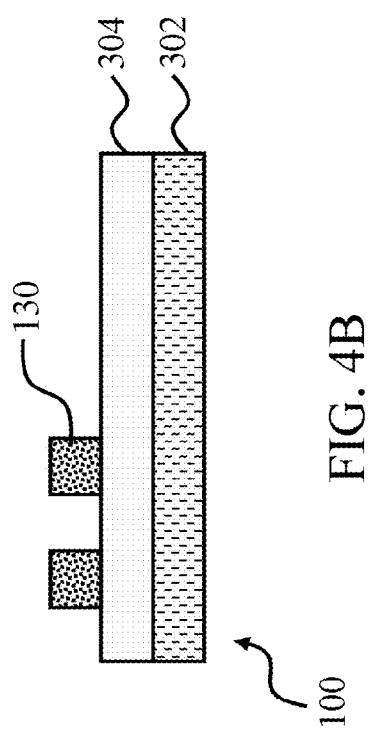

Referring to FIGS. 3A, 3B, 4A, and 4B, a layer of photoresist is applied to the device 100 above the SiN fins 130 and above the substrate 110, which includes layers of SiON 302 and SiO2 304. The first mask 210 is used in a lithography process to form an L-shaped photoresist pattern 312 on the device. The L-shaped pattern corresponds to the pattern 212 of the mask 210 (FIG. 2A). A SiN-selective etch process (not selective to SiO2) is then performed to remove the portions of the SiN fins 130 outside of the L-shaped pattern to produce the L-shaped fin pattern as shown in FIG. 4A. Some example etchants are CF4 or SF6. Afterwards, the L-shaped photoresist pattern 312 is removed. As shown in FIG. 4A, the ends of the fins 130 are ragged, in that they are neither the correct length, nor uniform. It is also noted that the right edge of the second fin down, as shown in FIG. 4A, is undesirably curved, following the inside corner of the L-shape. This is due, at least in part, to lithography resolution limits.

Figure 5A:
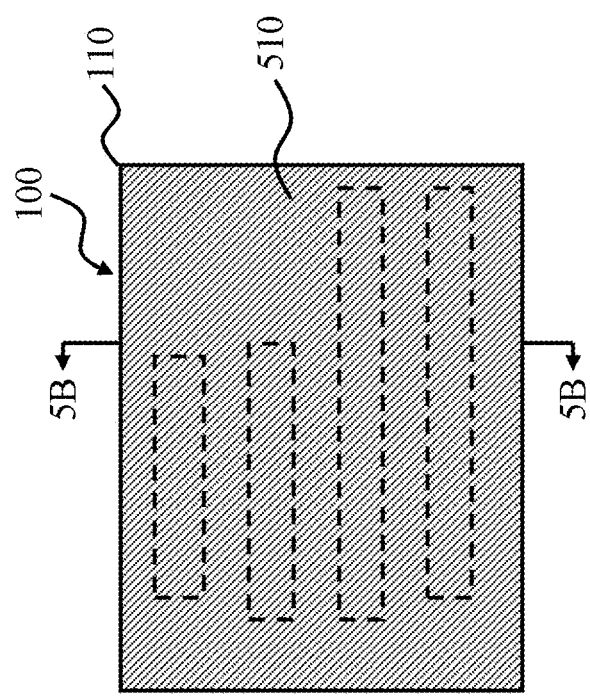
Figure 5B:
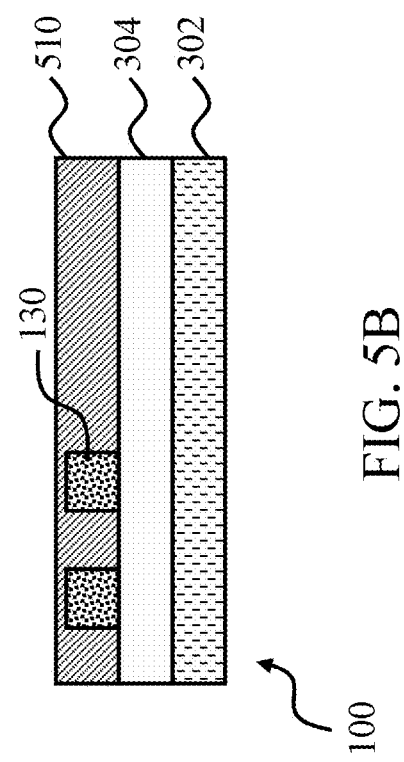
Figure 6A:
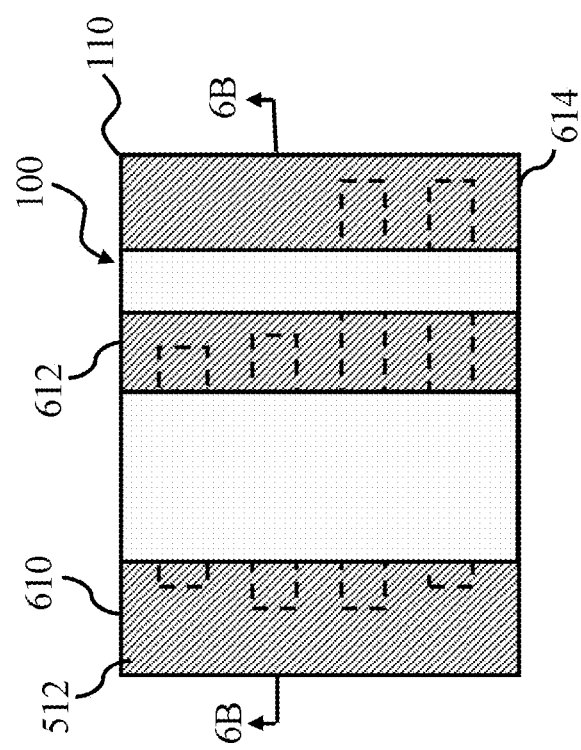
Figure 6B:
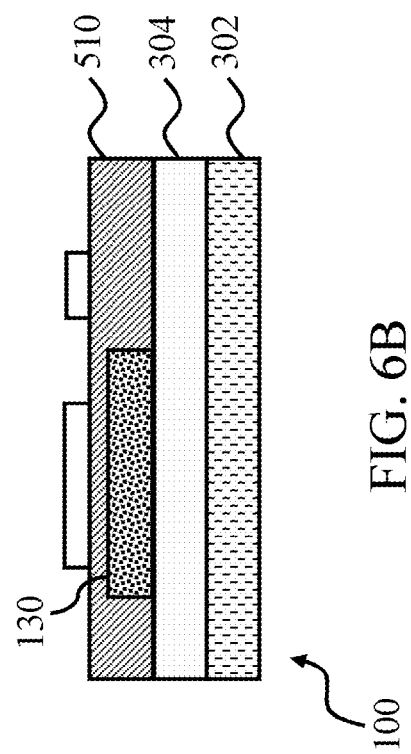

Referring to FIGS. 5A and 5B, in the present embodiment, a layer of amorphous silicon (a-Si) 510 is deposited over the top surface of the device 100, including the fins 130. The a-Si layer 510 can be deposited by various processes, such as by exposing the device 100 to a silicon-containing gas, such as SiH4. Note that a-Si is optional, and any material that with high selectivity to SiO2 and SiN below can be used.

Figure 7A:
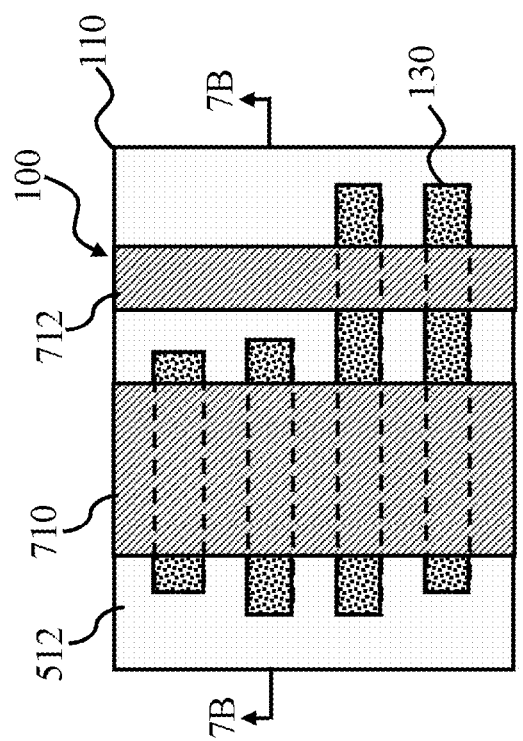
Figure 7B:
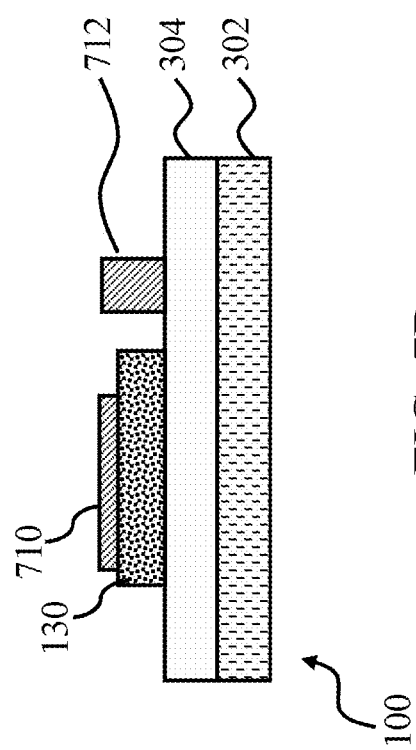
Figure 8A:
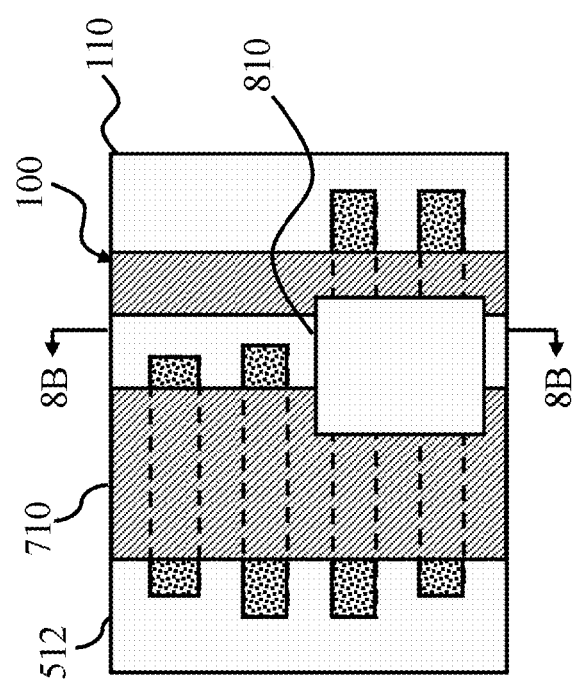
Figure 8B:
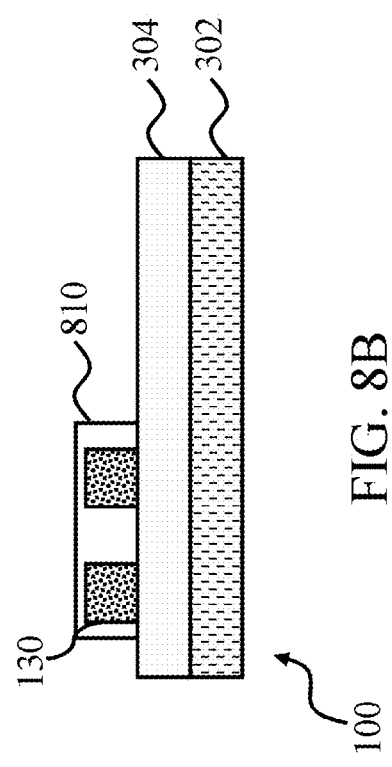
Figure 9A:
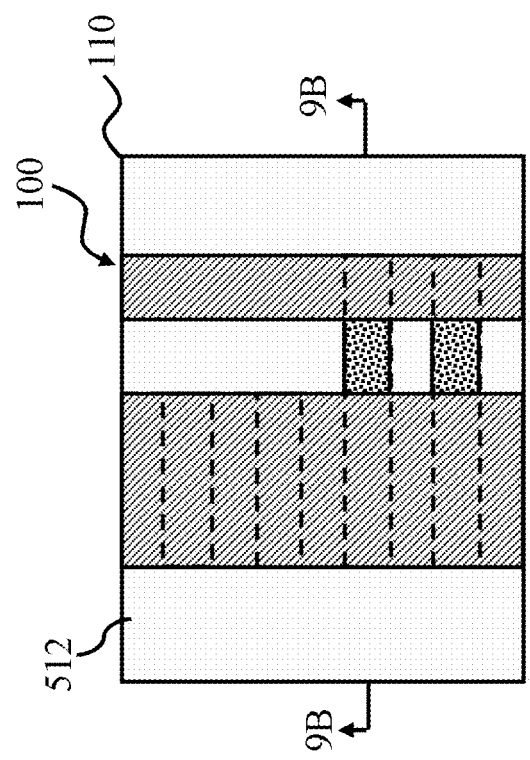
Figure 9B:
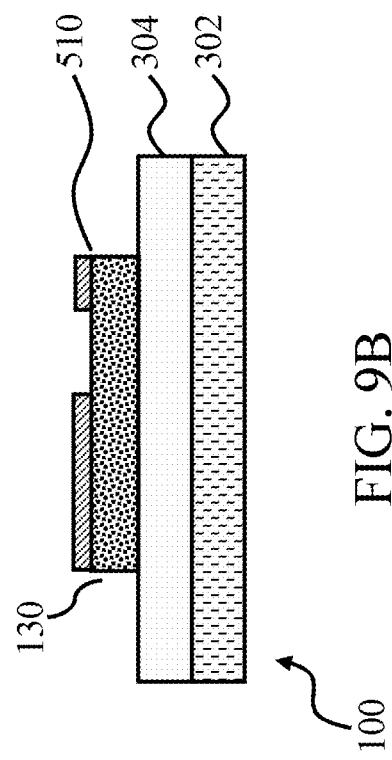

Referring to FIGS. 6A, 6B, 7A, and 7B, a layer of photoresist is applied to the device 100 above the a-Si layer 510, and the second mask 220 is used in a lithography process to form three rectangular photoresist patterns 610, 612, 614 on the device, which correspond to the three patterns 222, 224, 226 of the mask 220 (FIG. 2B). An a-Si selective etch process (not selective to SiN or SiO2) is then performed to remove the portions of the a-Si inside of three rectangular photoresist patterns 610, 612, 614 to produce a hardmask pattern in the a-Si 512, referred to as hardmask patterns 710, 712 (FIGS. 7A, 7B). Example etchants include Cl2 or HBr. With specific reference to FIG. 7A, it is noted that the left and right edges of the hardmask patterns 710, 712 cut straight across the fins 130 in the horizontal direction, aligned with some of the corresponding edges of the desired L-shaped pattern discussed above with reference to mask 212 (FIG. 2A).

Referring to FIGS. 8A, 8B, 9A, and 9B, a layer of photoresist is applied to the device 100 above the SiN fins 130 and above the SiO2 layer 110, and the third mask 230 is used in a lithography process to form a square-shaped photoresist pattern 810 on the device. A SiN-selective etch process (not selective to a-Si or SiO2) is then performed to remove the portions of the SiN fins 130 outside of the hardmask patterns 710, 712 and the square-shaped photoresist pattern 810. Example etchants include CF4 or SF6. Afterwards, the square-shaped photoresist pattern 810 is removed.

Figure 10A:
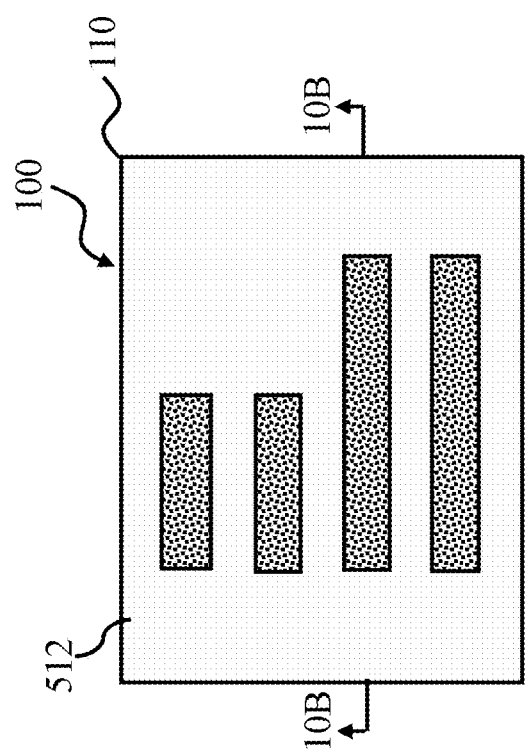
Figure 10B:
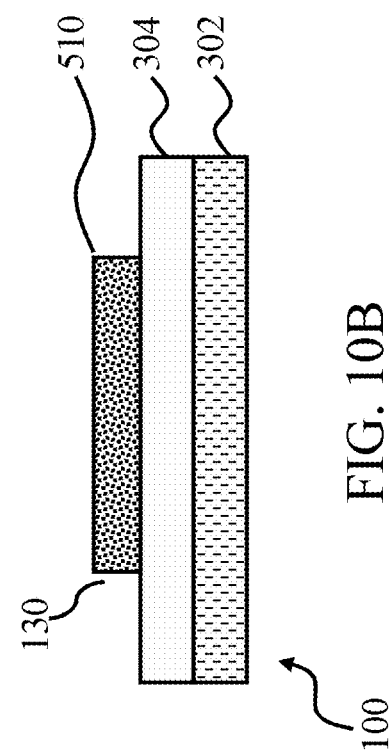

Referring to FIGS. 10A and 10B, a-Si selective etch process (not selective to SiN or SiO2) is then performed to remove the hardmask patterns 710, 712. Example etchants include Cl2 or HBr. As a result, an L-shaped pattern of fins 130 is provided on the device, as shown in FIG. 10A. The mask patterns 610, 612, 614 reduce or eliminated any uneven or ragged alignment of the fins 130. Also, by using two sets of mask patterns, patterns 610, 612, 614 and pattern 810, there is little to no rounding in the inside corner of the combined pattern.

The present disclosure is not limited to making a pattern of fins. FIGS. 11A-19B are directed to embodiments of a method for making a device with a pattern of trenches. The method below includes many of the same or similar process steps as discussed above, and for the sake of brevity, such repetitive steps will not be repeated in the following discussion.

For the following embodiments, it is desired to pattern the group of spacers 130 shown in FIG. 1C to a predetermined pattern of trenches. As in the previous example, the following discussion will be directed to forming an L-shaped pattern of trenches. An L-shaped pattern emphasizes some difficulties that often occur in the patterning process, similar to those discussed above with respect to fins.

Figure 11A:
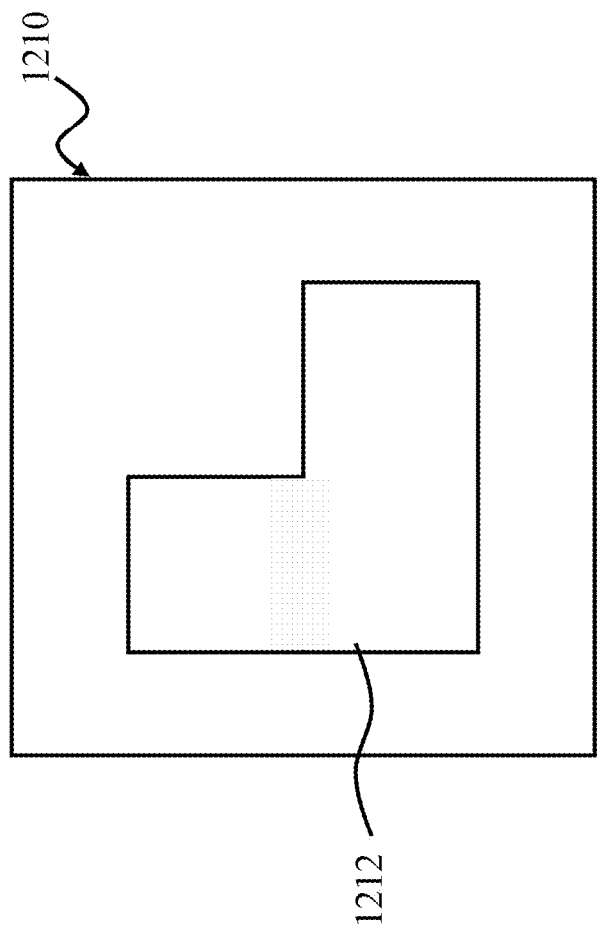
FIGS. 11A-11C are top views of a series of masks used for further processing the device of FIG. 1 according to one or more additional embodiments of the present disclosure.
Figure 11B:
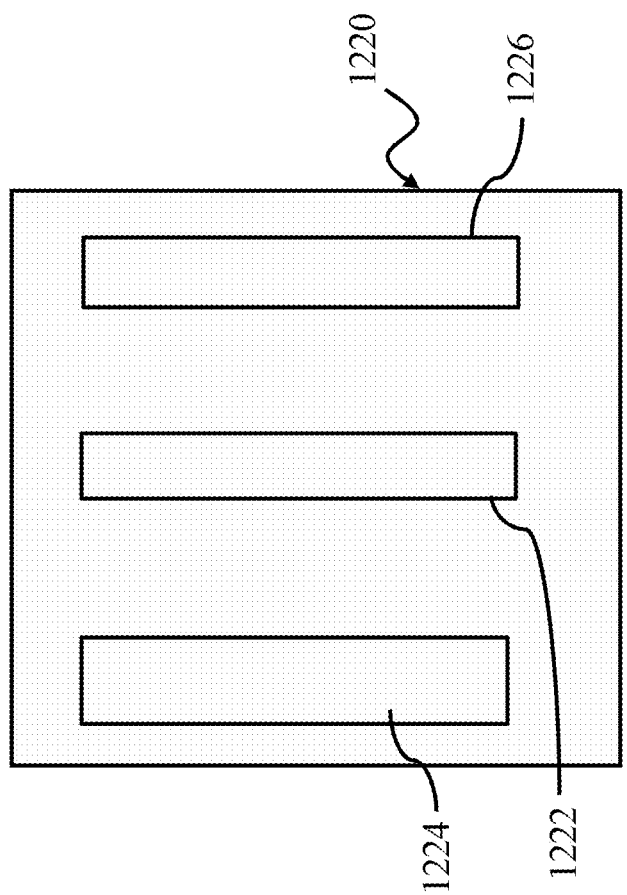
Figure 11C:
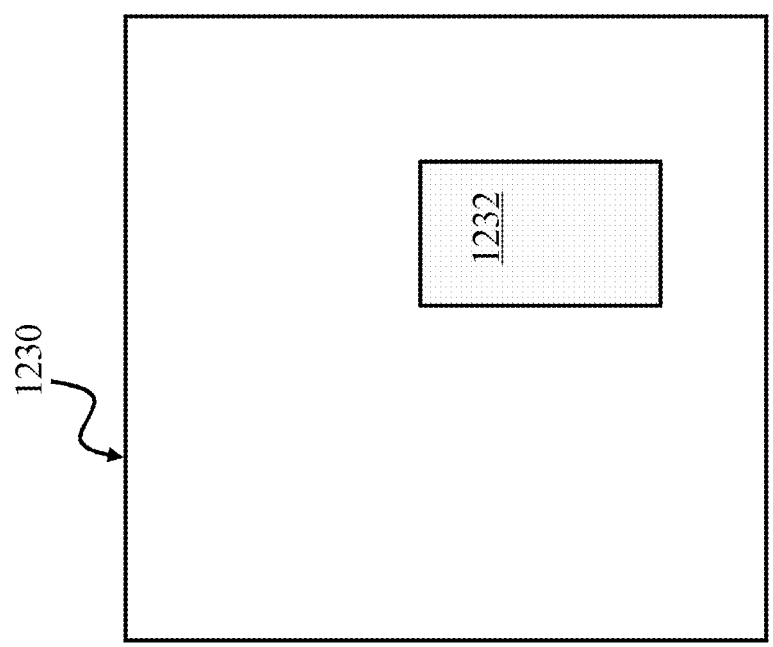

Referring now to FIGS. 11A-11C, a set of three masks 1210, 1220, 1230 will be used in the present embodiment to arrange spacers into an L-shape pattern of trenches. It is understood that the masks can be modified according to general understandings of lithography and mask making, as is well known in the art. Furthermore, the lithography processes discussed below can be of various types and include multiple steps, such as those discussed above with reference to FIGS. 1A-1C.

The first mask 1210 is used for line cutting, and provides the L-shaped pattern 1212 that is desired in the present embodiment. In the present example, the L-shaped pattern 1212 is the same as the L-shaped pattern 212 of the mask 210 in FIG. 2A. The L-shaped pattern 1212 will be used to form a corresponding L-shape pattern of trenches on the device 100. The second mask 1220 includes a plurality of patterns 1222, 1224, 1226 that will be used for end cutting the various spacers 130, for improved accuracy and precision of the L-shaped pattern. It is noted that the patterns 1222, 1224, 1226 are an inverse of the patterns 222, 224, 226 of the second mask 220 in FIG. 2B. The third mask 1230 includes one or more patterns 1232, that will be used in conjunction with the patterns 1222, 1224, 1226 as further discussed below. It is noted that the pattern 1232 is an inverse of the pattern 232 of the third mask 230 in FIG. 2C.

The method begins with a general pattern of spacers on an integrated circuit device. The first steps of the method are the same as those discussed above with reference to FIGS. 1A-1C, 2A, and 3A-5B. For the sake of example, a similar device, substrate, and set of spacers discussed above in FIG. 5B will be used for the following discussion, referring to them as device 1100, SiO2 layer 1110, and SiN spacers 1130. As a result, a ragged arrangement of spacers 1130 are formed in a general L-shape. Furthermore, the device 1100 is covered by a layer of a-Si 1510.

Figure 12A:
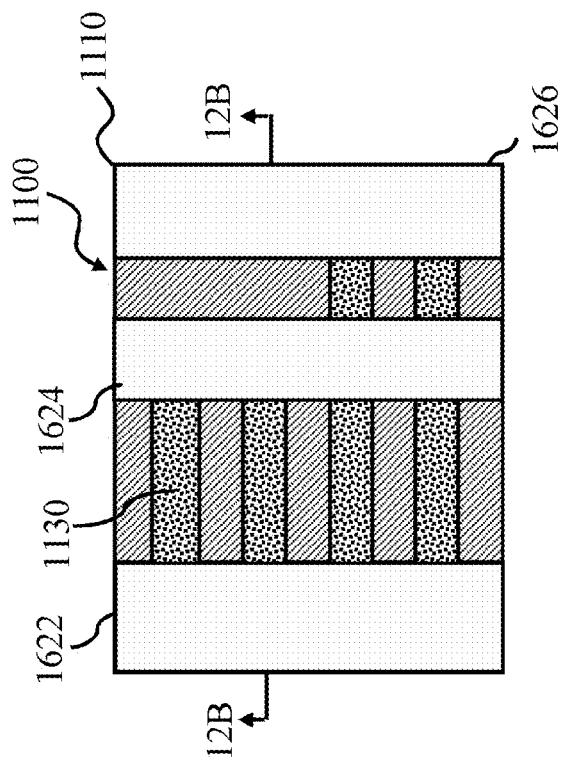
Figure 12B:
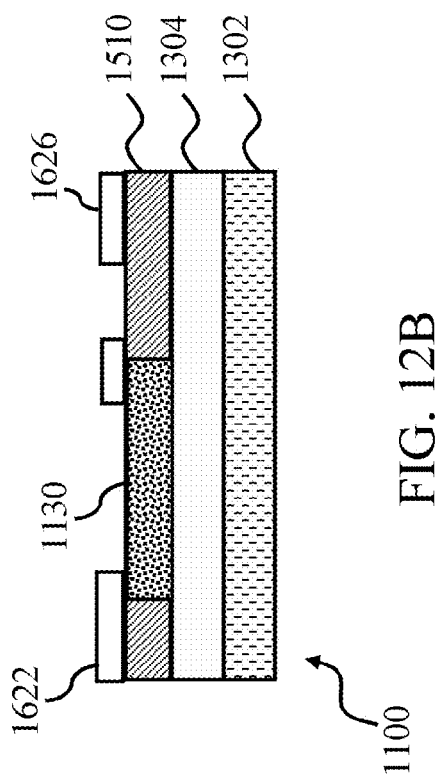
Figure 13A:
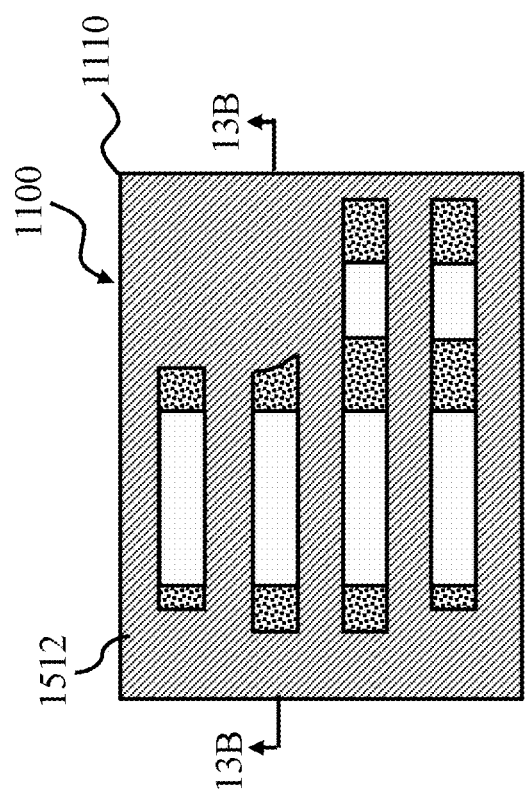
Figure 13B:
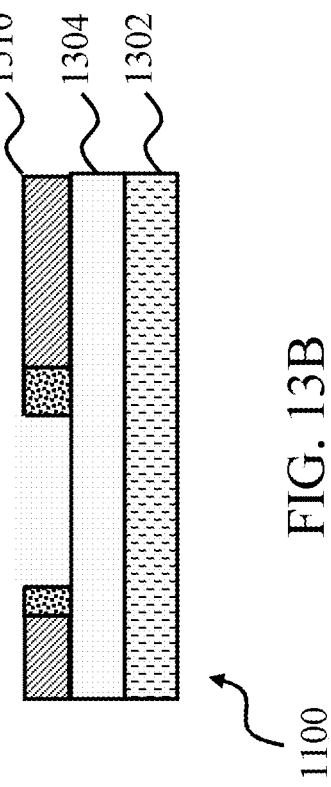
Figure 14A:
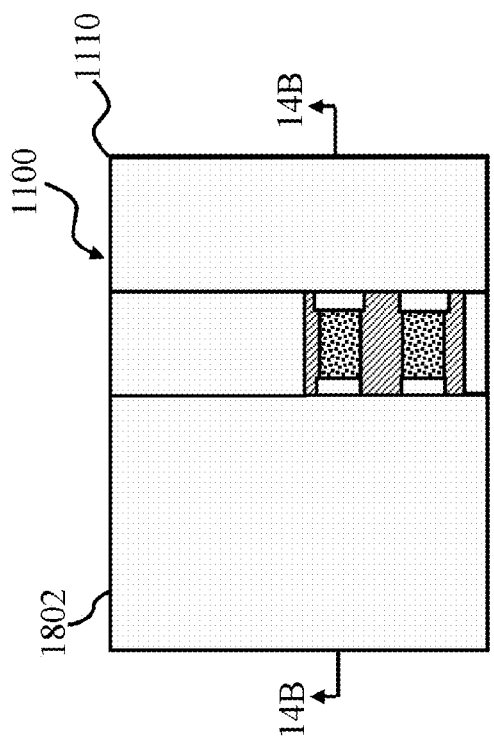
Figure 14B:
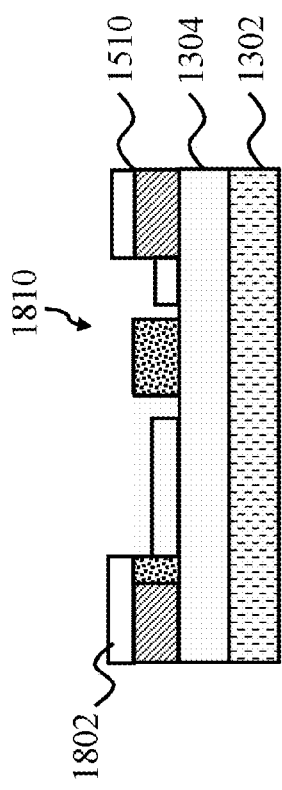
Figure 15A:
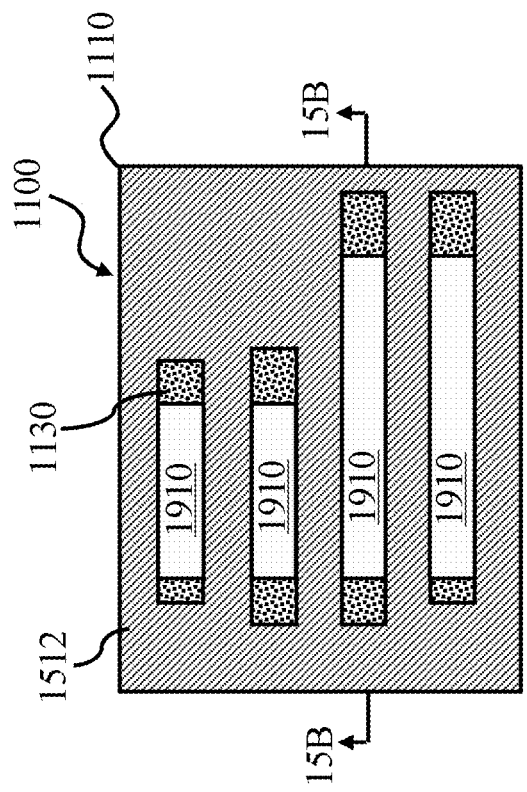
Figure 15B:
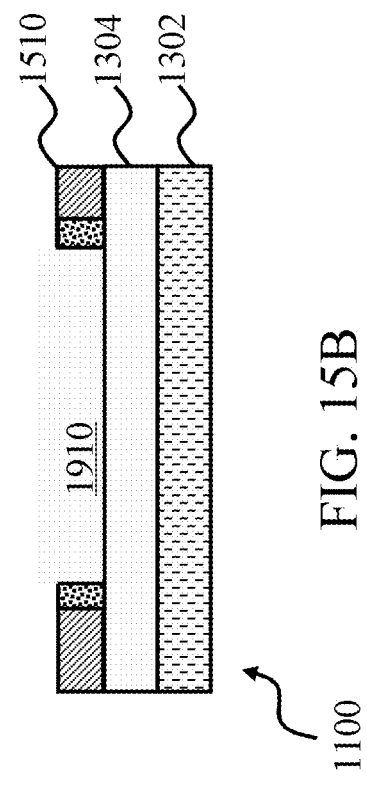

Referring to FIGS. 12A, 12B, 13A, and 13B, a layer of photoresist is applied to the device 1100 above the a-Si layer 1510, and the second mask 1220 is used in a lithography process to form three rectangular photoresist patterns 1622, 1624, 1626 on the device, which correspond to the three patterns 1222, 1224, 1226 of the mask 1220 (FIG. 12B). A SiN selective etch process (not selective to SiO2, and only partially selective to a-Si) is then performed to remove the portions of the spacers outside of the three rectangular photoresist patterns 1622, 1624, 1626, thereby exposing the underlying SiO2 layer 1304. Example etchants include CF4 or SF6. This produces corresponding gaps in the spacers 1130, as shown in FIGS. 13A, 14B. With specific reference to FIG. 13A, it is noted that the left and right edges of the missing spacers are straight in the horizontal direction, aligned with some of the corresponding edges of the desired L-shaped pattern discussed above with reference to mask 1212 (FIG. 11A).

Referring to FIGS. 14A, 14B, 15A, and 15B, a layer of photoresist 1802 is applied to the device 1100 above the SiN spacers 1130, the a-Si layer 1510, and above the SiO2 layer 1304. The third mask 1230 is used in a lithography process to form a square-shaped photoresist hole 1810 above the device. A SiN-selective etch process (not selective to SiO2) is then performed to remove the portions 1910 of the SiN spacers 1130 exposed in the square-shaped photoresist hole 1810. Example etchants include CF4 or SF6. Afterwards, the photoresist 1802 is removed.

Figure 17A:
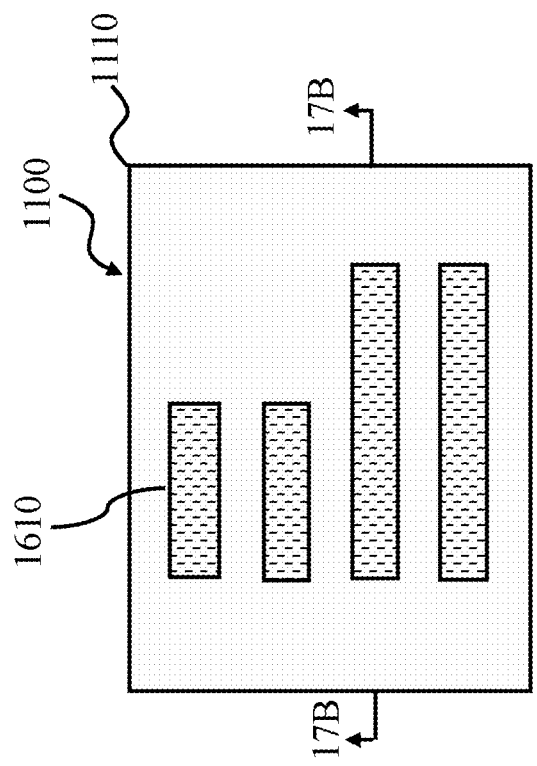
Figure 17B:
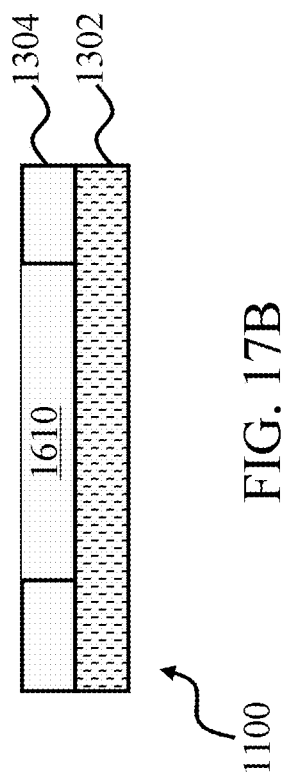

Referring to FIGS. 16A, 16B, 17A, and 17B, A SiO2 selective etch process (not selective to SiN or a-Si) is then performed to remove the exposed SiO2 layer 1304, thereby forming the trenches 1610. Example etchants include CF4 or SF6. Afterwards, an a-Si and SiN selective etch process (not selective to SiO2) is performed to remove the a-Si layer 1512 and any remaining portions of the spacer 1130. Example etchants include Cl2 or HBr for etching the a-Si, followed by CF4 or SF6 for etching the SiN. As a result, an L-shaped pattern of trenches 1610 is provided on the device, as shown in FIG. 17A. It is noted that the trenches 1610 are not ragged, nor are there curved edges on the trenches.

Figure 18:
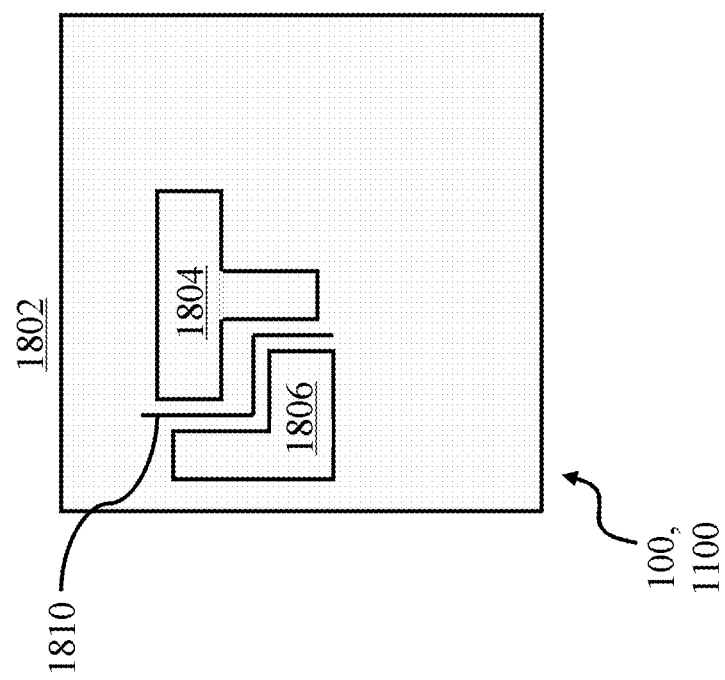
FIG. 18 is a top view of an integrated circuit device according to one or more embodiments of the present disclosure.

Referring now to FIG. 18, illustrated is the device 100 or the device 1100, with a circuit area 1802 that includes a plurality of non-rectangular areas 1804 and 1806. In the embodiment of the device 100, the non-rectangular area 1804 may include n-type FinFETs and the non-rectangular area 1806 may include p-type FinFETs. In this embodiment, a shallow trench isolation (STI) 1810 may be positioned between the two areas 1804 and 1806. In the embodiment of the device 1100, the non-rectangular areas 1804 and 1806 may include a plurality of trenches. It is understood that although the non-rectangular areas 1804, 1806 are shown as L-shaped, other non-rectangular shapes may also be used, including U-shapes, E-shapes, and so forth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, instead of using the hardmask patterns 710, 712, another photoresist mask can be use, as long as it has the appropriate etch selectivity. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for patterning a plurality of features in a non-rectangular pattern, the method comprising:
    providing a substrate including a surface with a plurality of elongated protrusions, the elongated protrusions extending in a first direction;
    forming a first patterned mask layer on the plurality of elongated protrusions using a first mask, the first patterned mask layer covering only a first portion of the plurality of elongated protrusions;
    patterning the plurality of elongated protrusions using the first patterned mask layer to remove the portions of the plurality of elongated protrusions other than the first portion of the plurality of elongated protrusions thereby forming a first modified pattern of elongated protrusions that corresponds to the first portion of the plurality of elongated protrusions;
    forming a second patterned mask layer over the first modified pattern of elongated protrusions using a second mask, wherein the second patterned mask layer extends perpendicular to the first direction, and wherein forming the second patterned mask layer over the first modified pattern of elongated protrusions includes performing a photolithography process with the second mask to form the second patterned mask layer over the first modified pattern of the elongated protrusions;
    providing a third patterned mask layer on the first modified pattern of elongated protrusions using a third mask, the third patterned mask layer being of a different material than the second patterned mask layer and positioned to prevent a portion of the first modified pattern of the elongated protrusions from being altered by a subsequent patterning process; and
    performing the subsequent patterning process on the first modified pattern of elongated protrusions using the second mask layer and the third mask layer to form the plurality of features in the non-rectangular pattern.

2. The method of claim 1 wherein the second patterned mask layer is a hardmask layer.

3. The method of claim 2 wherein the first and third patterned mask layers are photoresist and the hardmask is an amorphous silicon hardmask.

4. The method of claim 1 wherein the plurality of features are fins for fin-like field effect transistor (FinFET) devices.

5. The method of claim 1 wherein the non-rectangular pattern is an L-shaped pattern.

6. The method of claim 1 wherein the plurality of features are trenches.

7. The method of claim 1 wherein the second and third mask layers are photoresists with different etch selectivities.

8. A method comprising:
    providing a substrate including a surface with a first layer and a second layer;
    forming a plurality of elongated protrusions in a third layer above the first and second layers;
    forming a first patterned layer over the plurality of elongated protrusions, the first patterned layer covering only a first portion of the plurality of elongated protrusions;
    etching the plurality of elongated protrusions using the first patterned layer as a mask to remove the portions of the plurality of elongated protrusions other than the first portion of the plurality of elongated protrusions thereby forming a first pattern of the plurality of elongated protrusions that corresponds to the first portion of the plurality of elongated protrusions, the first pattern including at least one inside corner;
    after etching the plurality of elongated protrusions to form the first pattern of the plurality of elongated protrusions, forming a second patterned layer over the first pattern of the plurality of elongated protrusions;
    forming a third patterned layer over the first pattern of the plurality of elongated protrusions; and
    etching the first pattern of the plurality of elongated protrusions using the second and third patterned layers to form a second pattern of the plurality of elongated protrusions, the second pattern including at least one inside corner.

9. The method of claim 8, wherein the third patterned layer overlies at least a portion of the second patterned layer.

10. The method of claim 8 wherein forming the second patterned layer includes:
    providing a layer of amorphous silicon over the substrate including the first pattern of the plurality of elongated protrusions; and patterning the amorphous silicon into a hardmask to form the second patterned layer.

11. The method of claim 8 wherein the plurality of elongated protrusions extend in a first direction, and the second pattern layer is configured to make end cuts on the plurality of elongated protrusions in a direction perpendicular to the first direction.

12. The method of claim 11 wherein the third patterned layer is configured to mask a portion of the plurality of elongated protrusions from having end cuts according to the second pattern layer.

13. The method of claim 11 wherein the first layer includes silicon oxynitride, the second layer includes silicon dioxide, and the elongated protrusions include silicon nitride.

14. The method of claim 13, where the silicon nitride elongated protrusions in the second pattern are fins of the type used for a fin-type field effect transistor.

15. The method of claim 13, wherein etching the plurality of elongated protrusions using the second and third patterned layers forms a pattern of trenches in the layer including silicon dioxide.

16. A method comprising:
forming a plurality of spacers on a substrate,
forming a first material layer over the plurality of spacers,
patterning the first material layer over the plurality of spacers to form a first patterned material layer mask;
after patterning the first material layer, etching the plurality of spacers using the first patterned material layer mask to form a first pattern of the plurality of spacers;
after etching the plurality of spacers using the first patterned material layer to form the first pattern of the plurality of spacers, forming a second material layer over the first pattern of the plurality of spacers;
patterning the second material layer over the first pattern of the plurality of spacers to form a second patterned material layer mask, the second patterned material layer mask including a first portion and second portion such that an opening extends between the first portion and the second portion that exposes a portion of the first pattern of the plurality of spacers, the portion of the first pattern of the plurality of spacers extending the entirety of the opening between the first and second portions;
forming a third material layer over the second patterned material layer and within the opening to cover the entire portion of the first pattern of the plurality of spacers;
patterning the third material layer over the second patterned material layer to form a third patterned material layer mask; and
etching the first pattern of the plurality of spacers using the second and third patterned material layer masks to form a second pattern of the plurality of spacers.

17. The method of claim 16, wherein forming the plurality of spacers on the substrate includes forming each spacer from the plurality of spacers in a rectangular shape; and
wherein patterning the first material layer over the plurality of spacers to form the first patterned material layer includes patterning the first material layer to form an L-shaped first patterned material layer over the plurality of spacers.

18. The method of claim 16, wherein the third patterned material layer mask overlaps only a portion of the opening between the first and second portions of the second patterned material layer mask.

19. The method of claim 16, wherein patterning the third material layer includes removing a portion of the third material layer within the opening to expose the portion of the first pattern of the plurality of spacers.

20. The method of claim 16, further comprising:
after etching the first pattern of the plurality of spacers using the second and third patterned material layer masks to form the second pattern of the plurality of spacers, removing the third patterned material layer mask over the second patterned material layer mask; and
after removing the third patterned material layer mask over the second patterned material layer, removing the second patterned material layer mask over the first pattern of the plurality of spacers.

\* \* \* \* \*